US010311767B2

(12) United States Patent
Choi et al.

(10) Patent No.: US 10,311,767 B2
(45) Date of Patent: Jun. 4, 2019

(54) DISPLAY DEVICE AND METHOD OF SENSING CHARACTERISTICS OF THIN FILM TRANSISTORS HAVING DIFFERENT TYPES OF ELECTRICAL CHARACTERISTICS

(71) Applicant: LG Display Co., Ltd., Seoul (KR)

(72) Inventors: Sohee Choi, Paju-si (KR); Namyong Gong, Paju-si (KR); Sungsoo Shin, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 10 days.

(21) Appl. No.: 15/821,359

(22) Filed: Nov. 22, 2017

(65) Prior Publication Data

US 2018/0151099 A1     May 31, 2018

(30) Foreign Application Priority Data

Nov. 25, 2016   (KR) .................. 10-2016-0158431

(51) Int. Cl.
*G09G 3/00* (2006.01)
*G09G 3/3233* (2016.01)
*H01L 27/12* (2006.01)
*H01L 29/786* (2006.01)

(52) U.S. Cl.
CPC .......... *G09G 3/006* (2013.01); *G09G 3/3233* (2013.01); *H01L 27/1222* (2013.01); *H01L 27/1225* (2013.01); *H01L 29/78672* (2013.01); *G09G 2300/0814* (2013.01); *G09G 2310/08* (2013.01); *G09G 2330/10* (2013.01)

(58) Field of Classification Search
None
See application file for complete search history.

(56) References Cited

U.S. PATENT DOCUMENTS

| 8,334,826 | B2 * | 12/2012 | Min | G09G 3/3233 |
| | | | | 315/169.3 |
| 10,002,891 | B2 * | 6/2018 | Yamazaki | G09G 3/20 |
| 10,062,327 | B2 * | 8/2018 | Tani | G09G 3/3233 |
| 10,074,306 | B2 * | 9/2018 | Kim | G09G 3/3233 |
| 10,109,237 | B2 * | 10/2018 | Park | G09G 3/3233 |
| 2009/0051628 | A1 * | 2/2009 | Kwon | G09G 3/3233 |
| | | | | 345/77 |
| 2010/0289830 | A1 * | 11/2010 | Yamamoto | G09G 3/3233 |
| | | | | 345/690 |

(Continued)

*Primary Examiner* — Chad M Dicke
(74) *Attorney, Agent, or Firm* — Polsinelli PC

(57) ABSTRACT

A display device is disclosed. The display device includes subpixels including data lines, scan lines, and one or more thin film transistors (TFTs). The display device includes a second switching TFT configured to output a reference signal input through a drain node to a source node according to a second scan signal input through a gate node, a first switching TFT configured to have a drain node connected to the source node of the second switching TFT, and form a current path such that the reference signal input through the drain node is transmitted to the data line according to a first scan signal input to a gate node, and an integrated circuit (IC) unit configured to sense a voltage of a current transmitted to the data line through the first switching TFT and sense a threshold voltage of the first switching TFT based on the sensed voltage.

21 Claims, 17 Drawing Sheets

(56) References Cited

U.S. PATENT DOCUMENTS

| | | | | |
|---|---|---|---|---|
| 2011/0164071 A1* | 7/2011 | Chung | ............... | G09G 3/3208 345/690 |
| 2011/0216056 A1* | 9/2011 | Yoo | ............... | G09G 3/32 345/212 |
| 2011/0273419 A1* | 11/2011 | Park | ............... | G09G 3/30 345/211 |
| 2012/0050350 A1* | 3/2012 | Matsui | ............... | G09G 3/3233 345/690 |
| 2013/0083087 A1* | 4/2013 | Byun | ............... | G09G 3/3233 345/690 |
| 2013/0162617 A1* | 6/2013 | Yoon | ............... | G09G 3/3291 345/211 |
| 2014/0022288 A1* | 1/2014 | Tsuge | ............... | G09G 3/3233 345/690 |
| 2015/0187276 A1* | 7/2015 | Shim | ............... | G09G 3/3233 345/77 |

* cited by examiner

DISPLAY DEVICE AND METHOD OF SENSING CHARACTERISTICS OF THIN FILM TRANSISTORS HAVING DIFFERENT TYPES OF ELECTRICAL CHARACTERISTICS

CROSS-REFERENCE TO RELATED APPLICATION

This application claims the benefit of Korean Patent Application No. 10-2016-0158431, filed on Nov. 25, 2016, the entire disclosure of which are hereby incorporated by reference herein for all purposes.

BACKGROUND

Field of the Disclosure

The present disclosure relates to a display device, and more particularly to a display device and a method of sensing element characteristics of an electroluminescent display.

Description of the Background

An active matrix electroluminescent display includes organic light emitting diodes (OLEDs) capable of emitting light by itself or quantum dot light emitting diodes (QLEDs) and has advantages of a fast response time, a high emission efficiency, a high luminance, a wide viewing angle, and the like.

Referring to FIG. 1, the OLED includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When a power supply voltage is applied to the anode electrode and the cathode electrode, holes passing through the hole transport layer HTL and electrons passing through the electron transport layer ETL move to the emission layer EML and form excitons. As a result, the emission layer EML generates visible light.

The electroluminescent display arranges pixels each including an OLED in a matrix form and adjusts a luminance of the pixels based on a gray scale of video data. Each pixel includes a driving thin film transistor (TFT) controlling a driving current flowing in the OLED based on a gate-to-source voltage of the driving TFT, and at least one switching TFT programming the gate-to-source voltage of the driving TFT. Each pixel adjusts the display gray scale (luminance) by an amount of emitted light of the OLED which is proportional to the driving current.

In such an electroluminescent display, there is a known technique of driving pixels at a low speed in order to reduce power consumption when a change in an input video is small. Since a refresh period of the video data is lengthened at a time of low speed driving, the video data charged in the pixels cannot be maintained at a target level and leak. In order to minimize the leakage of such video data, in the conventional low-speed driving technology, some of the TFTs of the pixels are formed of oxide TFTs having good off-current characteristics, and the remaining TFTs other than the TFTs in the pixels are formed of a low temperature polysilicon (LTPS) TFT. Thus, in the related art, the TFT connected to the gate electrode of the driving TFT is formed of an oxide TFT, and the remaining TFTs are formed of the LTPS TFT.

FIG. 2 is the related art one-pixel circuit including an oxide TFT and an LTPS TFT. FIG. 3 is a driving waveform of FIG. 2. Referring to FIGS. 2 and 3, the pixel PXL includes an organic light emitting diode (OLED), a plurality of thin film transistors (ST1 to ST3, DT), and two capacitors Cst1 and Cst2. In FIG. 2, "Coled" represents a parasitic capacitance of the OLED.

The TFTs ST1 to ST3 and DT are implemented as n-type MOSFETs (hereinafter referred to as NMOS). For low-speed driving, a first switch TFT ST1 is formed of an NMOS type oxide TFT having good off-current characteristics. The remaining TFTs ST2, ST3, and DT are formed of NMOS type LTPS TFTs having good response characteristics.

The pixel PXL is driven through a scanning period and an emission period (Te). The scanning period may be set to approximately one horizontal period 1H and include an initialization period Ti, a sampling period Ts, and a programming period Tw.

During the initialization period Ti, a predetermined reference voltage Vref is applied to a data line DL. During the initialization period Ti, a voltage of a gate node Ng is initialized to the reference voltage Vref, and a voltage of a source node Ns is initialized to a predetermined initializing voltage Vinit.

During the sampling period Ts, while the potential of the gate node Ng is maintained at the reference voltage Vref, the potential of the source node Ns is raised by a drain-source current Ids. According to such a source-follower method, a gate-source voltage Vgs of the driving TFT DT is sampled as a threshold voltage Vth of the driving TFT DT, and the sampled threshold voltage Vth is stored in a first capacitor Cst1. At the end of the sampling period Ts, the voltage of the gate node Ng becomes the reference voltage Vref and the voltage of the source node Ns becomes a voltage equal to the difference between the reference voltage Vref and the threshold voltage Vth.

During the programming period Tw, a data voltage Vdata is applied to the gate node Ng and a voltage distribution result between the capacitors Cst1 and Cst2 with respect to the voltage change Vdata-Vref of the gate node Ng is reflected to the source node Ns, and thereby the gate-source voltage Vgs of the driving TFT DT corresponding to the desired driving current is programmed.

During the light emission period (Te), according to the driving current, the OLED is emitted to realize the luminance corresponding to the video data.

Such a pixel circuit is designed on the assumption that the characteristics such as the threshold voltage and the mobility of the TFTs for driving are all the same. However, actual TFT characteristics are not uniform in accordance with a process variation, a driving time, a driving environment, and the like which occur in manufacturing a TFT. Accordingly, various methods for sensing whether the TFT of the display device is operating within an allowable error range are known.

However, when the pixel circuit is composed of two types of TFTs such as an oxide TFT and an LTPS TFT, since the oxide TFT has a completely different electrical characteristic from the LTPS TFT, it is difficult to sense the characteristics of the oxide TFT in the conventional sensing method. Therefore, a new technique for evaluating characteristics of each TFT in a pixel circuit including an oxide TFT is required.

SUMMARY

In one aspect, there is provided a display device comprising subpixels including a data line, a scan line, and one or more thin film transistors (TFTs), comprising a second switching TFT having gate, source and drain nodes, outputting a reference signal input through the drain node to the source node according to a second scan signal input through the gate node, a first switching TFT having gate, source and drain nodes, the drain node connected to the source node of the second switching TFT, and the first switching TFT forming a current path such that the reference signal input through the drain node is transmitted to the data line according to a first scan signal input through the gate node, and an integrated circuit (IC) unit sensing a voltage of a current transmitted to the data line through the first switching TFT and sensing a threshold voltage of the first switching TFT based on the sensed voltage.

The IC unit may include a digital to analog converter (DAC) outputting a predetermined analog signal such that a load of the data line connected to the source of the first switching TFT is initialized when the first switching TFT is in an off state.

The IC unit may include an analog to digital converter (ADC) sensing a voltage of a current transmitted to the data line through the first switching TFT and outputting the sensed voltage as a digital signal.

The IC unit may include a sampling switch adjusting a timing of the outputting the digital signal.

The first switching TFT and the second switching TFT may be formed of an N-type oxide TFT. At least one switching TFT for driving the subpixel may be implemented as an N-type low temperature polysilicon (LTPS) TFT or a combination of an N-type LTPS TFT and a P-type LTPS TFT.

In another aspect, there is provided a display device comprising subpixels including a data line, a scan line, and one or more thin film transistors (TFTs), comprising a second switching TFT having gate, drain and source nodes, outputting a reference signal input through the drain node to the source node according to a second scan signal input through the gate node, a first switching TFT having gate, drain and source nodes, the drain node connected to the source node of the second switching TFT, and forming a current path such that the reference signal input through the drain node is transmitted to the data line according to a first scan signal input through the gate node, and an IC unit, when a predetermined condition is satisfied, being switched to a diagnostic mode, sensing a voltage of a current transmitted to the data line through the first switching TFT, sensing a threshold voltage of the first switching TFT based on the sensed voltage, and reporting the sensed threshold voltage of the first switching TFT.

The IC unit may be configured to display a pixel determined to contain a defective TFT to be visually distinguished from other pixels as a graphical screen according to the sensed result of the threshold voltage of the first switching TFT and report the sensed threshold voltage of the first switching TFT.

The IC unit may be configured to transmit the sensed result of the threshold voltage of the first switching TFT to a predetermined server through a network and report the sensed threshold voltage of the first switching TFT.

The first switching TFT and the second switching TFT may be formed of an N-type oxide TFT. And at least one switching TFT for driving the subpixel may be implemented as an N-type LTPS TFT or a combination of an N-type LTPS TFT and a P-type LTPS TFT.

The predetermined condition may be satisfied when a quality test is performed on the display device at a production site, a diagnostic function of the display device is selected, or the display device may be entered a predetermined diagnostic mode.

In yet another aspect, there is provided a method of sensing element characteristics of a display device comprising subpixels including a data line, a scan line, a second switching TFT having gate, drain and source nodes, inputting a reference signal through the drain node and outputting the reference signal to the source node, and a first switching TFT having gate, drain and source nodes, the drain node connected to the source node of the second switching TFT, and the source node connected to the data line, the method comprising applying a second scan signal to the second switching TFT to output the reference signal input through the drain node to the source node, applying a first scan signal to the first switching TFT to output the reference signal input through the drain node to the source node, and sensing a voltage of a current transmitted to the data line through the first switching TFT and sensing a threshold voltage of the first switching TFT based on the sensed voltage.

The method of sensing element characteristic of a display device may further comprise applying the first scan signal to turn off the first switching TFT, and outputting a predetermined analog signal to the data line so that a load of the data line to which the first switching TFT is connected is initialized.

The sensing a threshold voltage of the first switching TFT may comprise sensing a voltage of a current transmitted to the data line according to a predetermined period, and outputting the sensed voltage as a digital signal.

In a further aspect of the present disclosure, there is provided a display device comprising subpixels including a data line, a scan line, and one or more thin film transistors (TFTs) comprising a second switching TFT having gate, drain and source nodes, outputting a reference signal input through the drain node to the source node according to a second scan signal input through the gate node, a first switching TFT having gate, drain and source nodes, the drain node connected to the source node of the second switching TFT, and forming a current path such that the reference signal input through the drain node is transmitted to the data line according to a first scan signal input through the gate node, and an IC unit sensing a voltage of a current transmitted to the data line through the first switching TFT, sensing a threshold voltage of the first switching TFT based on the sensed voltage, and reporting the sensed threshold voltage of the first switching TFT when a quality test is performed on the display device at a production site, a diagnostic function of the display device is selected, or the display device is entered a predetermined diagnostic mode.

The IC unit may display a pixel determined to contain a defective TFT to be visually distinguished from other pixels as a graphical screen according to the sensed result of the threshold voltage of the first switching TFT and report the sensed threshold voltage of the first switching TFT.

The IC unit may transmit the sensed result of the threshold voltage of the first switching TFT to a predetermined server through a network and report the sensed threshold voltage of the first switching TFT.

The IC unit may include a digital to analog converter (DAC) outputting a predetermined analog signal such that a load of the data line connected to the source of the first switching TFT is initialized when the first switching TFT is in an off state.

The IC unit may include an analog to digital converter (ADC) sensing a voltage of a current transmitted to the data line through the first switching TFT and outputting the sensed voltage as a digital signal.

The IC unit includes a sampling switch adjusting a timing of the outputting the digital signal.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Figure 1:
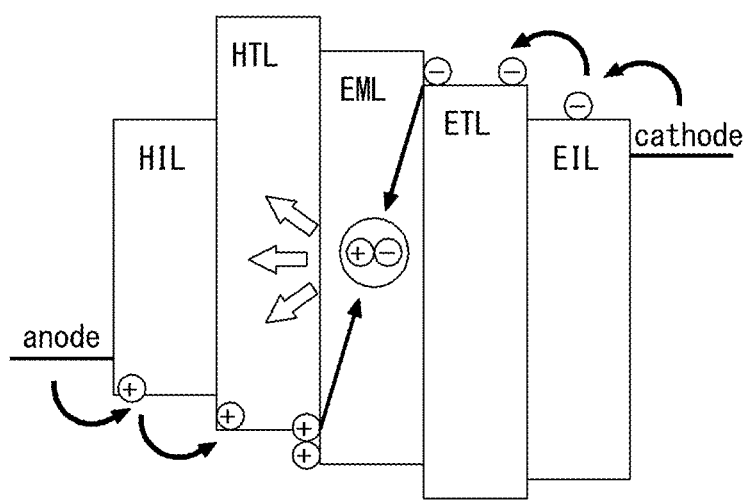
FIG. 1 is a diagram illustrating an OLED structure.
Figure 2:
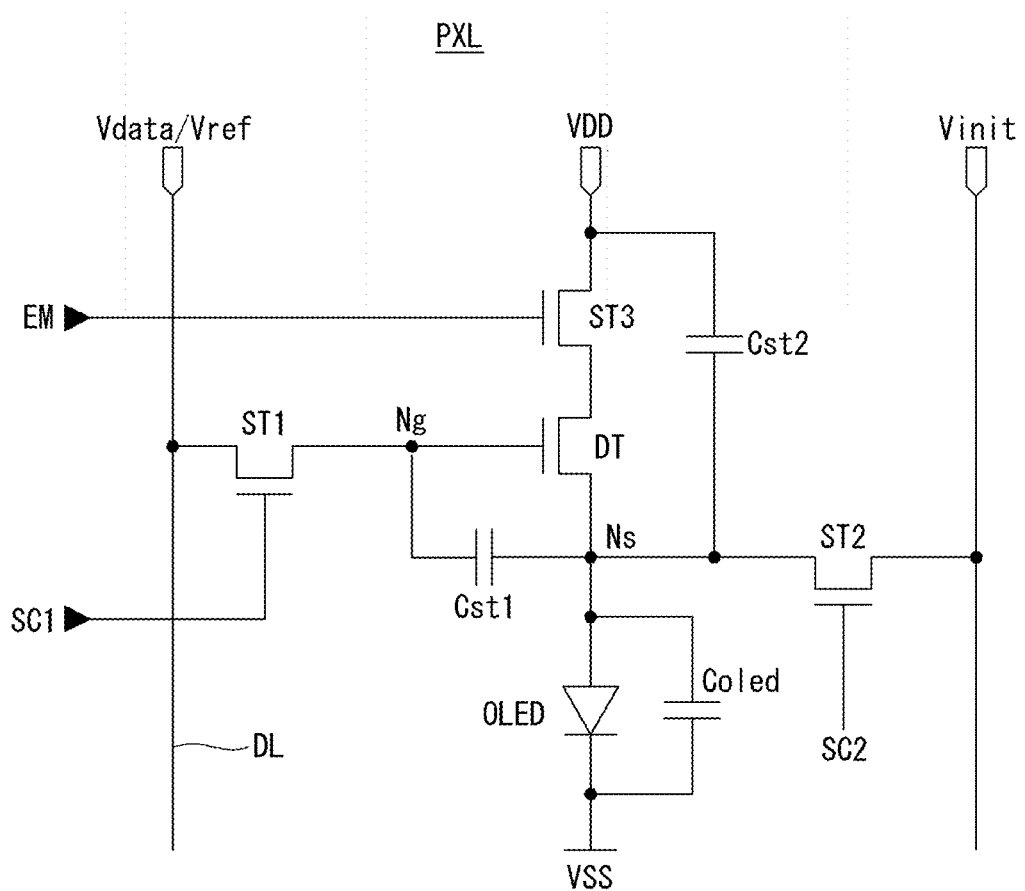
FIG. 2 is the related art one-pixel circuit including an oxide TFT and an LTPS TFT.
Figure 3:
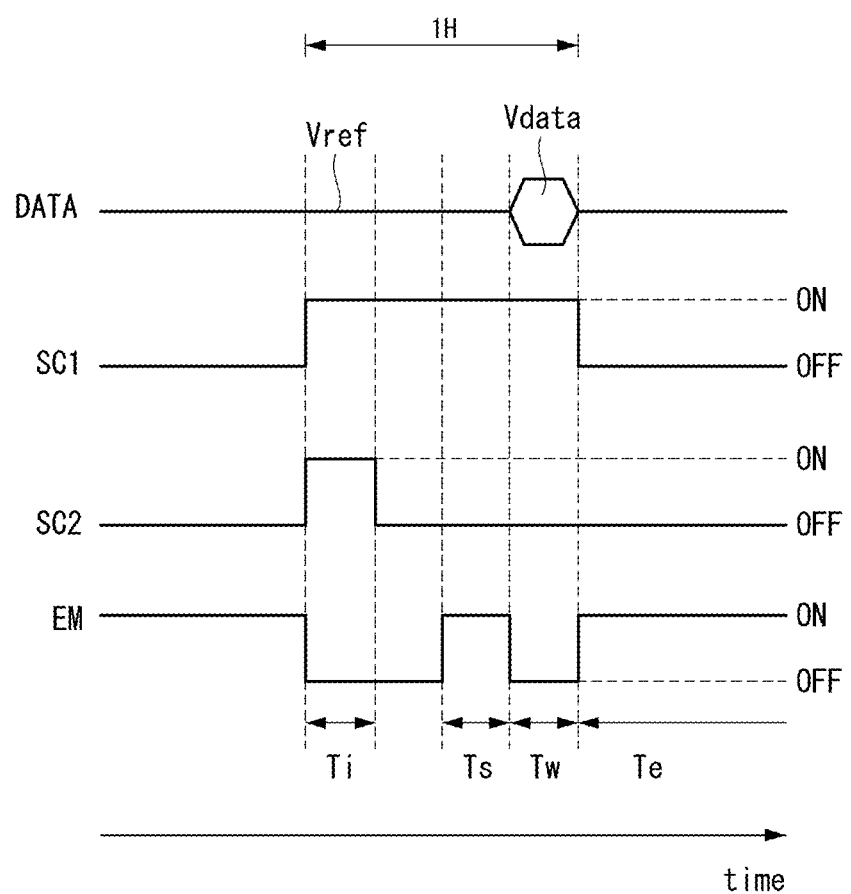
FIG. 3 is a driving waveform diagram of FIG. 2.

Reference will now be made in detail to aspects of the disclosure examples of which are illustrated in the accompanying drawings.

Advantages and features of the present disclosure and methods for accomplishing the same will become apparent with reference to the aspects described in detail below with reference to the accompanying drawings. However, the present disclosure is not limited to aspects disclosed below, and may be implemented in various forms. These aspects are provided so that the present disclosure will be exhaustively and completely described, and will fully convey the scope of the present disclosure to those skilled in the art to which the present disclosure pertains. The present disclosure is only defined by the scope of the claims.

Shapes, sizes, ratios, angles, number, and the like illustrated in the drawings for describing aspects of the present disclosure are merely exemplary, and the present disclosure is not limited thereto. Like reference numerals designate like elements throughout the description. In the following description, when a detailed description of well-known functions or configurations related to this document is determined to unnecessarily cloud a gist of the disclosure, the detailed description thereof will be omitted. In the present disclosure, when the terms "include", "have", "comprised of", etc. are used, other components may be added unless "~only" is used. A singular expression can include a plural expression as long as it does not have an apparently different meaning in context.

In the explanation of components, even if there is no separate description, it is interpreted as including an error range.

In the description of position relationship, when a structure is described as being positioned "on or above", "under or below", "next to" another structure, this description should be construed as including a case in which the structures contact each other as well as a case in which a third structure is disposed therebetween.

The terms "first", "second", etc. may be used to describe various components, but the components are not limited by such terms. The terms are used only for the purpose of distinguishing one component from other components. For example, a first component may be designated as a second component without departing from the scope of the present disclosure.

Like reference numerals designate like elements throughout the description.

The features of various aspects of the present disclosure can be partially combined or entirely combined with each other, and can be technically interlocking-driven in various ways. The aspects can be independently implemented, or can be implemented in conjunction with each other.

Various aspects of the present disclosure will be described in detail below with reference to the accompanying drawings. The component names used in the following description are selected in consideration of easiness of specification, and may be different from the parts names of actual products.

Figure 4:
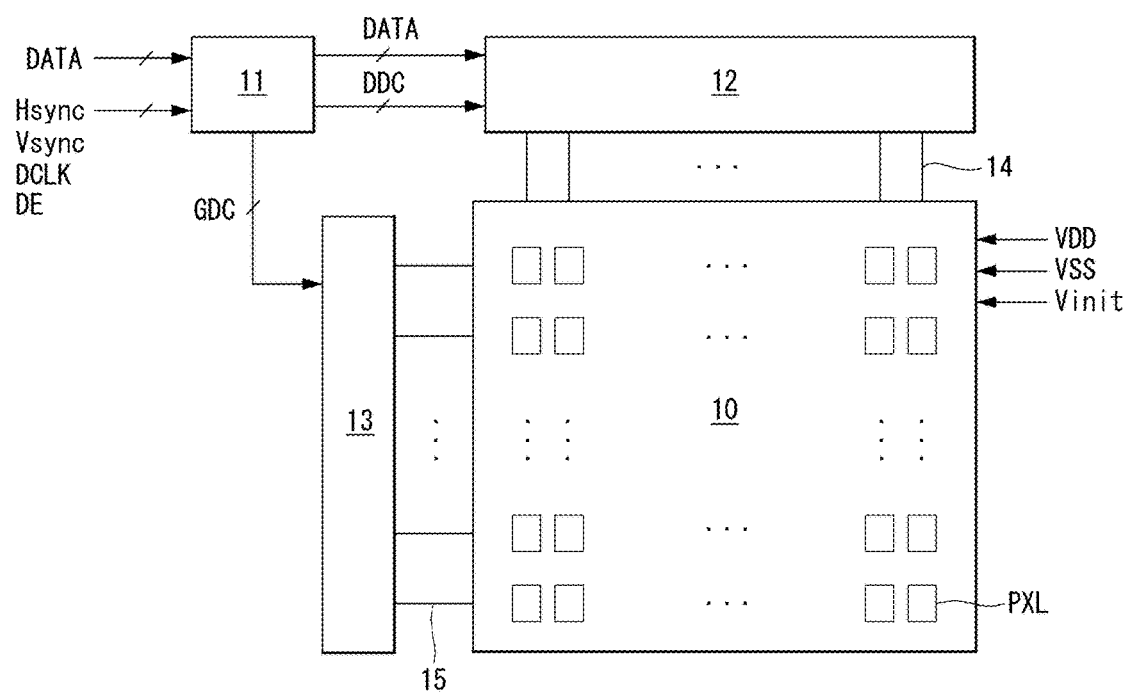
FIG. 4 is a block diagram illustrating an electroluminescent display according to an aspect of the present disclosure.

FIG. 4 illustrates an electroluminescent display according to an aspect of the present disclosure.

Referring to FIG. 4, an electroluminescent display according to the present disclosure includes a display panel 10 having a plurality of pixels PXL, display panel driving circuits 12 and 13 for driving signal lines connected to each of the pixels PXL, and a timing controller 11 for controlling the display panel driving circuits. The timing controller 11 and the display panel driving circuits 12 and 13 may be implemented as separate integrated circuits (ICs) (for example, in the case of a medium-sized or large-sized display device) or one driving circuit (or a driving IC) (for example, in the case of a small display device) by incorporating at least one of them.

The display panel driving circuits 12 and 13 write input video data DATA to each pixel PXL of the display panel 10. The display panel driving circuits 12 and 13 include a source driver 12 for driving data lines 14 connected to each of the pixels PXL and a scan driver 13 for driving gate lines 15 connected to each of the pixels PXL.

The timing controller 11 receives a digital data signal DATA and a driving signal including a data enable signal DE or a vertical synchronization signal Vsync, a horizontal synchronization signal Hsync and a clock signal DCLK from an video supply unit. Here, the timing controller 11 and the source driver 12 are functionally separated only for convenience of explanation. The present disclosure is not limited thereto, and each component can be selectively integrated. That is, the timing controller 11 and the source driver 12 may be implemented as a single driving IC. The component for supplying the video, the timing controller 11 and the source driver 12 may be implemented as a single driving IC.

The timing controller 11 generates a gate timing control signal GDC for controlling the operation timing of the scan driver 13 and a data timing control signal DDC for controlling the operation timing of the source driver 12 based on the driving signal.

The source driver 12 samples and latches the digital data signal DATA supplied from the timing controller 11 in response to the data timing control signal DDC supplied from the timing controller 11, converts it into a data voltage corresponding to a gamma reference voltage, and outputs the data voltage. The source driver 12 outputs the data voltage in an analog form via the data lines 14.

The source driver 12 converts the input video data DATA received from the timing controller 11 every frame in a basic driving mode into a data voltage Vdata and then supplies the data voltage Vdata to the data lines 14. The source driver 12 outputs the data voltage Vdata using a digital to analog converter (DAC) that converts the input video data DATA to a gamma compensation voltage.

The source driver 12 may generate and supply an initialization voltage Vinit to an initialization voltage supply line 16, a high potential driving voltage VDD to a VDD supply line, and a low potential driving voltage VSS to a VSS supply line.

The scan driver 13 outputs a scan signal in response to the gate timing control signal GDC supplied from the timing controller 11. The scan driver 13 outputs the scan signal through the scan lines 15.

The scan driver 13 outputs scan signals SC1 and SC2 under the control of the timing controller 11 to select the pixel PXL to which the data voltage is charged. The scan driver 13 is implemented as a shift register and can sequentially supply the scan signals to each of the scan lines by shifting a first scan signal SC1.

The scan driver 13 outputs an emission signal EM under the control of the timing controller 11 to control an emission timing of each pixel PXL to which the data voltage is charged. The scan driver 13 includes a shift register and an inverter, and can sequentially supply the signals to the scan lines by shifting the emission signal EM.

The data timing control signal DDC includes a source start pulse, a source sampling clock, and a source output enable signal, and the like. The source start pulse controls a sampling start timing of the source driver 12. The source sampling clock is a clock for shifting a data sampling timing.

The gate timing control signal GDC includes a gate start pulse, a gate shift clock, an emission shift clock, a gate output enable signal, and the like. The gate start pulse is generated at a beginning of a frame period every frame period and is input to the shift register of each of the scan drivers 13. The gate start pulse controls a start timing at which the scan signals SC1 and SC2 and the emission signal EM are output every frame period. The gate shift clock is input to the shift register of the scan driver 13 to control a shift timing of the shift register. The emission shift clock is input to the inverter of the scan driver 13 to control a shift timing of the inverter.

The pixel PXL of the electroluminescent display according to the present disclosure may include an oxide TFT having good off-current characteristics and a low temperature polysilicon (LTPS) TFT having a good speed of response. For example, a TFT connected to a gate electrode of a driving TFT may be formed of an oxide TFT, and the remaining TFTs may be formed of an LTPS TFT.

The oxide TFT may include an N-type oxide TFT or a P-type oxide TFT. The LTPS TFT may also include an N-type LTPS TFT or a P-type LTPS TFT. Accordingly, the pixel PXL to which the present disclosure is applied may include various combinations of TFTs as shown in the following Table 1.

TABLE 1

|   | Oxide TFT | LTPS TFT |
|---|-----------|----------|
| 1 | N-Type    | N-Type   |
| 2 | N-Type    | P-Type   |
| 3 | P-Type    | N-Type   |
| 4 | P-Type    | P-Type   |

The pixel PXL to which the present disclosure is applied includes a driving TFT for adjusting a current flowing in an OLED according to a gate voltage, a switching TFT connected to the gate electrode of the driving TFT, and a plurality of TFTs for driving the pixel PXL.

The driving TFT and the switching TFT are important elements for normal driving of the pixel PXL. Both the driving TFT and the switching TFT can be implemented as an oxide TFT or LTPS TFT. In the case of the switching TFT, the switching TFT may be implemented as an oxide TFT having excellent off-current characteristics. In the case of the driving TFT, the driving TFT may be implemented as an LTPS TFT having good response characteristics, but it may be implemented as an oxide TFT. The combination of the driving TFT and the switching TFT of the pixel PXL to which the present disclosure is applied may include TFTs of various combinations as shown in the following Table 2.

TABLE 2

|   | Switching TFT | Driving TFT |
|---|---------------|-------------|
| 1 | LTPS          | LTPS        |
| 2 | Oxide         | LTPS        |
| 3 | Oxide         | Oxide       |

As described above, the pixel PXL circuit to which the present disclosure is applied may include combinations of various substrates and various types of TFTs.

In the electroluminescent display in which the pixel PXL circuit having various TFT configurations is implemented, the present disclosure discloses characteristics of a switching TFT, for example, a technique capable of sensing and reporting a threshold voltage of an oxide TFT that performs a switching function.

According to an aspect of the present disclosure, the IC in the display device can sense the threshold voltage characteristic of the switching TFT and display it to the user as a form of graphic data. Further, by transmitting the sense result through a network and transmitting it to a server on the network, for example, an A/S server of a manufacturer, it is possible for the manufacturer to collect and manage information relating to the characteristics of the switching TFT of each display device. In this manner, the characteristics of the switching TFT included in the display device, particularly, the switching TFT formed of the oxide TFT can be sensed in the display device, and the sensed result can be reported, so that it can be effectively applied to quality control and performance improvement of the display device.

In the following description, when the switching TFT is formed of an NMOS type oxide TFT having good off-current characteristics and the remaining TFTs including the driving TFT are formed of LTPS POMS TFTs having good response characteristics, a method of sensing a threshold voltage of a switching TFT formed of an oxide NMOS will be described by applying the present disclosure.

Figure 5:
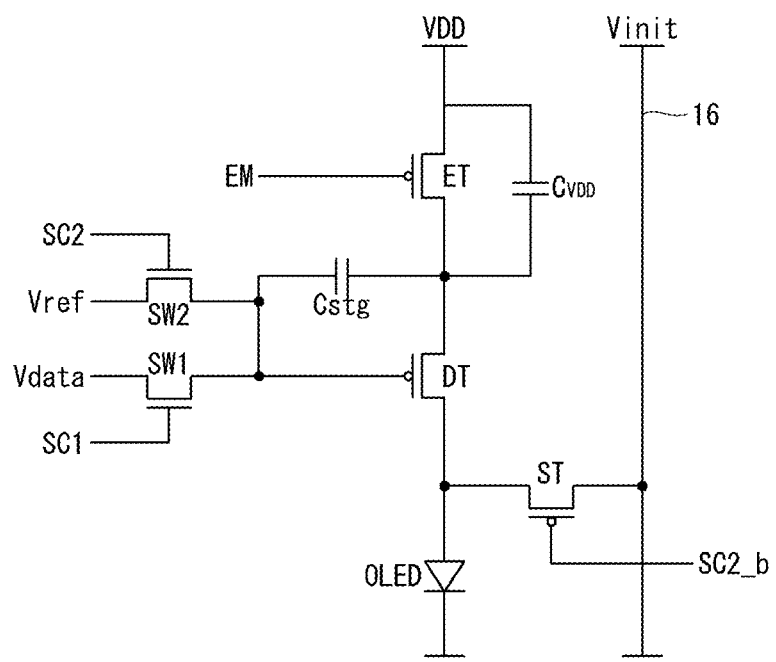
FIG. 5 illustrates a connection configuration of a pixel according to an aspect of the present disclosure.
Figure 6:
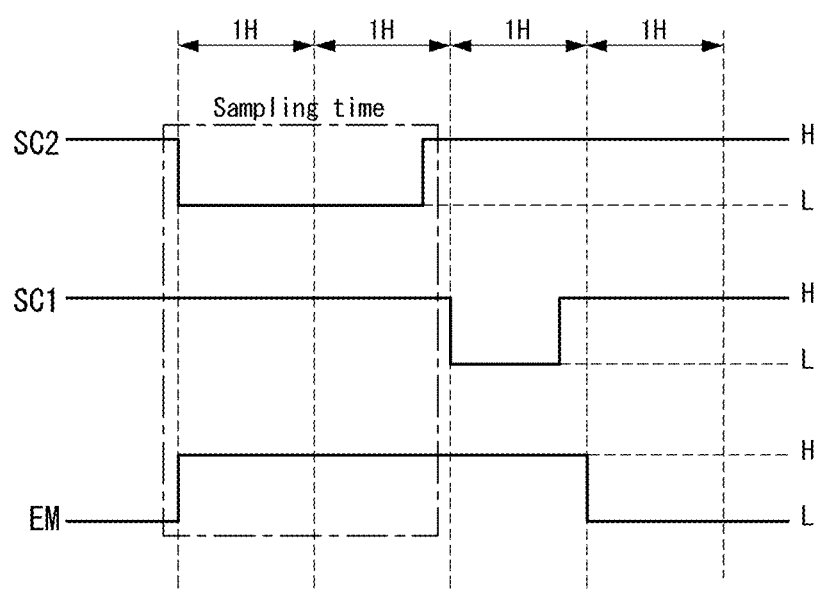
FIG. 6 is a waveform diagram illustrating main signals applied to a pixel of FIG. 5.

FIG. 5 illustrates a connection configuration of a pixel PXL according to an aspect of the present disclosure. FIG. 6 is a diagram illustrating a main driving signals supplied to a pixel PXL of FIG. 5.

Referring to FIGS. 5 and 6, the pixel PXL of the present disclosure includes an organic light emitting diode (OLED), a plurality of thin film transistors SW1, SW2, ET, DT, ST, and capacitors Cstg and $C_{VDD}$. But the present disclosure is not limited thereto, and the organic light emitting diode (OLED) may be replaced by a quantum dot light emitting diode (QLED).

A first switching TFT SW1 and a second switching TFT SW2 may be implemented as an oxide TFT having good off-current characteristics. When the first switching TFT SW1 is implemented as an oxide TFT, a change of a potential of a gate node due to a leakage current in a low-speed driving mode can be suppressed as much as possible. The first switching TFT SW1 applies a Vdata signal to a gate of a driving TFT DT in response to a first scan signal SC1. The second switching TFT SW2 applies a Vref signal to the gate of the driving TFT DT in response to a second scan signal SC2.

The remaining TFTs ET, DT, and ST other than the first switching TFT SW1 and the second switching TFT SW2 may be formed of an LTPS POMS TFT having good response characteristics.

The driving TFT DT adjusts a current flowing in the OLED according to a gate voltage. A source of the driving TFT DT is supplied with a high potential power supply voltage VDD. A drain of the driving TFT DT is connected to an anode of the OLED. The emission control TFT ET is turned on or off in response to a third scan signal EM. The sensing TFT ST connects an initial line 16 to the anode of the OLED in response to an inverted signal SC2_b of the second scan signal.

The driving TFT DT, the emission control TFT ET, and the sensing TFT ST included in a subpixel are based on a P-type transistor (PMOS TFT). The transistors included in the subpixel are not limited to this, and may be implemented as an N-type transistor (NMOS TFT), or a mixed structure of N-type and P-type transistors.

As shown in FIG. 6, the main driving signals input to the pixel PXL is as follows. The second scan signal SC2 is first input to a low level L and then is switched to a high level H. Thereafter, the first scan signal SC1 is input to a low level L, and then is switched to a high level H. The third scan signal EM is maintained at a high level H from a start of the second scan signal being input at the low level L. When the first scan signal SC1 is input to the low level L and then is switched to the high level H after the second scan signal, the third scan signal EM is switched to a low level L.

A method of sensing a threshold voltage of the first switching TFT SW1 to which the data signal Vdata is input according to an aspect of the present disclosure in the pixel PXL structure having such a configuration is as follows.

Figure 7:
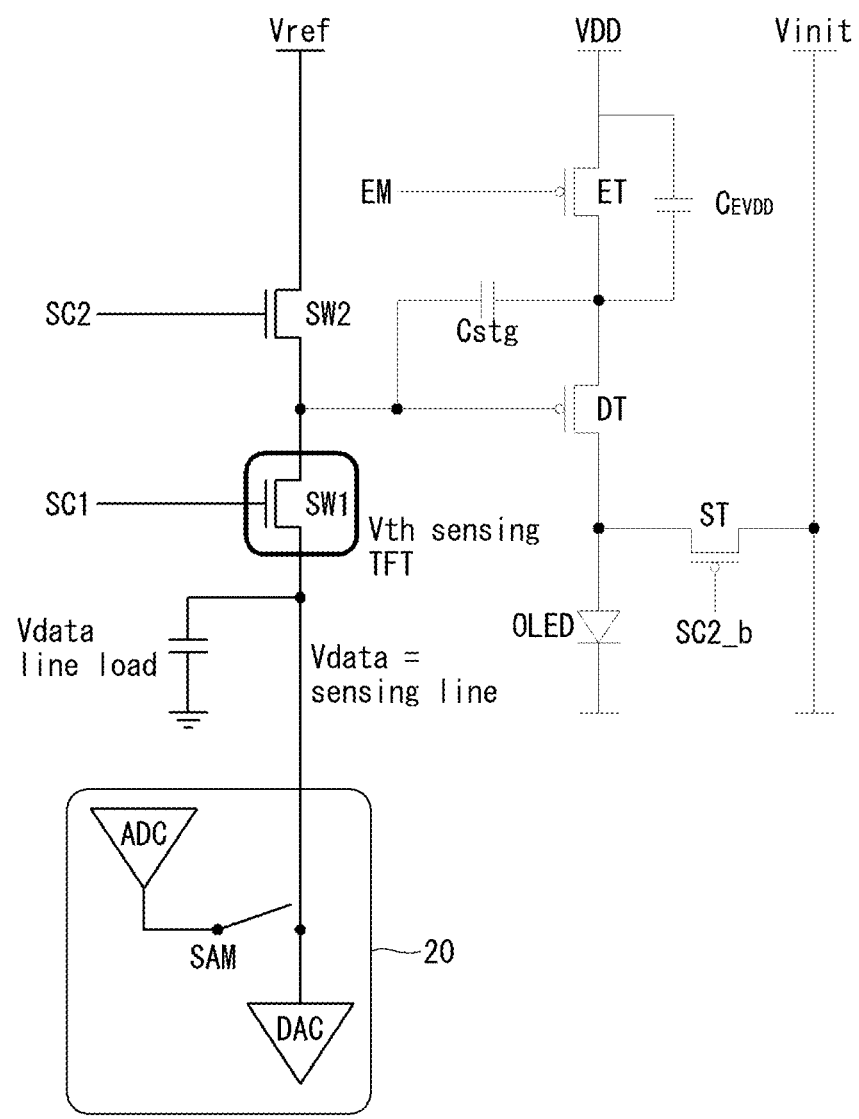
FIG. 7 is a circuit configuration for sensing characteristics of a switching TFT in a pixel according to an aspect of the present disclosure.
Figure 8:
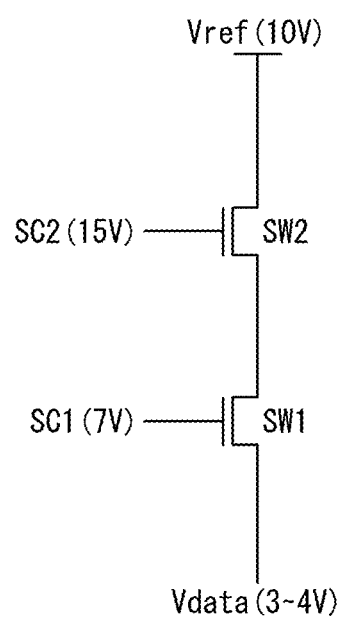
FIG. 8 is an equivalent circuit of a circuit for sensing characteristics of a switching TFT in a pixel of FIG. 7.

FIG. 7 is a circuit configuration for sensing the threshold voltage of the first switching TFT SW 1 to which the data signal Vdata is input in the pixel PXL structure having the above-described configuration. FIG. 8 is an equivalent circuit of a circuit for sensing characteristics of a first switching TFT SW1 in a pixel of FIG. 7.

Referring to FIG. 7, in order to sense the threshold voltage of the first switching TFT SW1, the threshold voltage of the first switching TFT SW1 can be sensed by using a Vref signal input through the second switching TFT SW2 as an input power supply and sensing the Vdata signal of the first switching TFT SW1 output to the data line.

The second scan signal SC2 is applied with a voltage higher than the Vref. Thus, the second switching TFT SW2 can be turned on.

The first scan signal SC1 is applied with a specific voltage lower than the Vref. Thus, a current input from the Vref can be finally output to the Vdata line connected to the source terminal of the first switching TFT SW1 through the second switching TFT SW2 and the first switching TFT SW1.

The second switching TFT SW2 is turned on, but the first switching TFT SW1 operates in response to the specific gate voltage SC1. That is, when the gate-source voltage of the first switching TFT SW1 becomes equal to the threshold voltage (Vgs=Vth), the first switching TFT SW1 is turned off and the current path is cut off. Thus, the threshold voltage of the first switching TFT SW1 can be sensed by comparing the voltage of the current finally output to the Vdata line with the voltage Vref. Therefore, the threshold voltage of the first switching TFT SW1 can be sensed by measuring the voltage (Vdata line load) of the current output to the Vdata line.

FIG. 8 is an equivalent circuit of a circuit for sensing characteristics of a first switching TFT SW1 in a pixel of FIG. 7.

For example, when a voltage of the Vref signal is 10V, the second scan signal SC2 is applied with a voltage of 15V higher than the Vref. The second switching TFT SW2 is turned on, so that the Vref signal of 10V can be transmitted to the first switching TFT SW1 without being affected by the second switching TFT SW2.

The first scan signal SC1 may be applied with 7V lower than the Vref. Thus, the first switching TFT SW1 operates at a gate voltage of 7V, and the Vref input to the first switching TFT SW1 is output as a different current according to the threshold voltage of the first switching TFT SW1.

The current output to the source terminal of the first switching TFT SW1 turns off when the gate-source voltage of the first switching TFT SW1 becomes equal to the threshold voltage (Vgs=Vth). Therefore, by measuring the voltage of the current finally output to the Vdata line, the threshold voltage of the first switching TFT SW1 can be calculated.

A series of processes for applying the second scan signal SC2 and the first scan signal SC1 to sense the characteristics of the first switching TFT SW1 and measuring the voltage of the current finally output to the Vdata line may be performed under a control of an IC unit 20 provided in the display device.

The IC unit 20 includes a DAC for outputting an analog signal for initializing the Vdata line and an ADC for sensing a voltage (Vdata line load) of a current output to the Vdata line and outputting a digital signal, and can sense the threshold voltage of the first switching TFT SW1 and report the sensed result. Although the IC unit 20 is shown as one block, this is illustrated to aid understanding of the technology. The functions performed by the IC unit 20 may be performed by any one of the ICs performing the functions of the timing controller 11, the source driver 12 and the scan driver 13, or one or more of them may be integrated into one, and may be performed by a driving IC implemented as one driving circuit.

Figure 9:
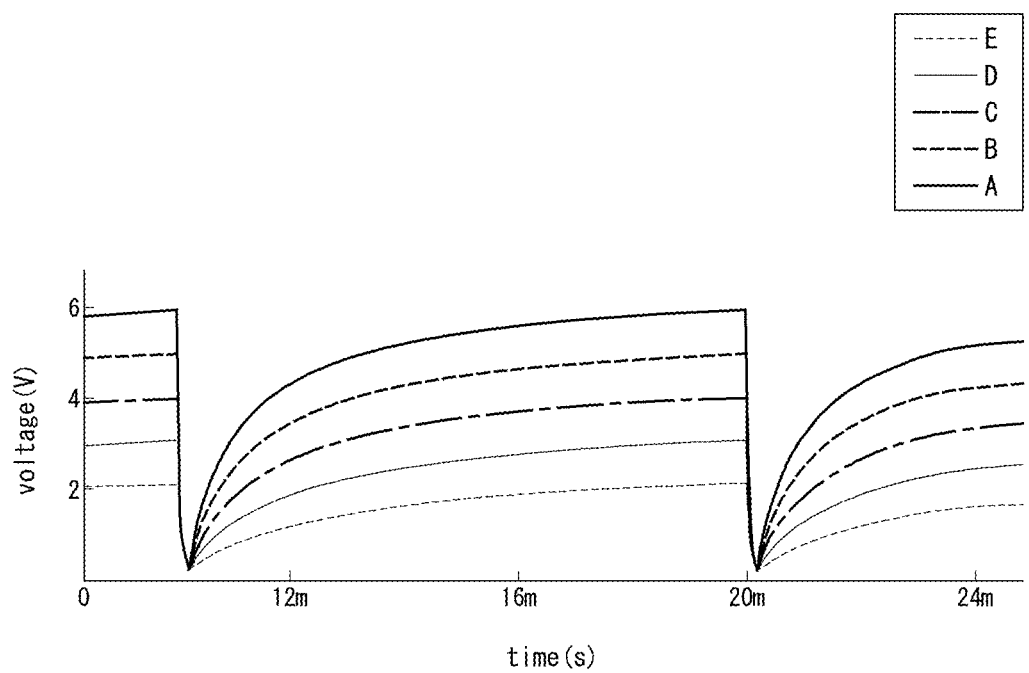
FIG. 9 is a graph illustrating a result of simulating a sensed result of a threshold voltage of a first switching TFT sensed by a voltage (Vdata line load) in a pixel of FIG. 7.

FIG. 9 is a graph illustrating a result of simulating a sensed result of a threshold voltage of a first switching TFT sensed by a voltage (Vdata line load) in a pixel of FIG. 7.

When the second switching TFT SW2 is turned on and the Vref power source is applied to the first switching TFT SW1, a current affected by the threshold voltage of the first switching TFT SW1 is output to the source terminal of the first switching TFT SW1.

The Vref power source is output to the Vdata line connected to the source terminal of the first switching TFT SW1. The current output to the source terminal is turned off when the gate-source voltage of the first switching TFT SW1 becomes equal to the threshold voltage of the first switching TFT SW1 (Vgs=Vth). Accordingly, in the simulated graph, since the Vdata line load gradually increases and after a time when Vgs=Vth, the current output to the source terminal of the first switching TFT SW1 is cut off, the Vdata line load is kept constant. As shown in the graph, when the threshold voltage characteristics of the first switching TFT SW1 are different from each other by A to E, the threshold voltage (Vth) of the first switching TFT SW1 sensed differently.

Figure 10:
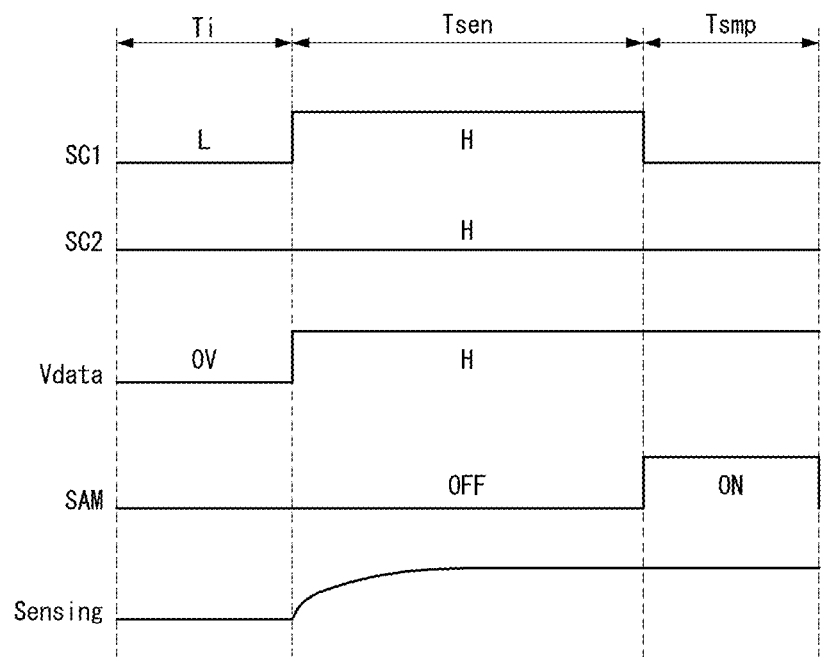
FIG. 10 is a diagram illustrating main driving signals input to sense characteristics of a switching TFT in a pixel according to an aspect of the present disclosure.

FIG. 10 is a signal diagram illustrating main driving signals input to sense characteristics of a switching TFT in a pixel according to an aspect of the present disclosure. FIG. 10 illustrates the main driving signals input to sense the characteristics of the first switching TFT SW1 in the pixel of FIG. 7. In the signal diagram, a high level H is a voltage level for turning on the NMOS type oxide TFT and a voltage level for turning off the PMOS type LTPS TFT. A low level L is a voltage level for turning off the NMOS type oxide TFT and a voltage level for turning on the PMOS type LTPS TFT.

During an initialization period Ti, the first scan signal SC1 is input at a low level L, and the second scan signal SC2 is input at a high level H. The Vdata signal is kept at 0V, that is, a state that no data is input. A sampling switch signal SAM for on/off-controlling a sampling switch SAM in the IC unit 20 is maintained in the OFF state. The sensed voltage Sensing is kept at 0, that is, a state that a sensed value is not present.

During a sensing period Tsen, the first scan signal SC1 is input at a high level H and the second scan signal SC2 is input at a high level. The Vdata signal is input at a high level H, that is, a state that data is input. The sampling switch signal SAM is kept in the OFF state. The sensed voltage Sensing is sensed according to the threshold voltage of the first switching TFT SW1.

During a sampling period Tsmp, the first scan signal SC1 is input at a low level L and the second scan signal SC2 is input at a high level H. The Vdata signal is maintained at a high level H, that is, a state that data is input. The sampling switch signal SAM is kept in the ON state. Thus, the sensed voltage Sensing is sensed and sampled according to the threshold voltage of the first switching TFT SW1.

Figure 11:
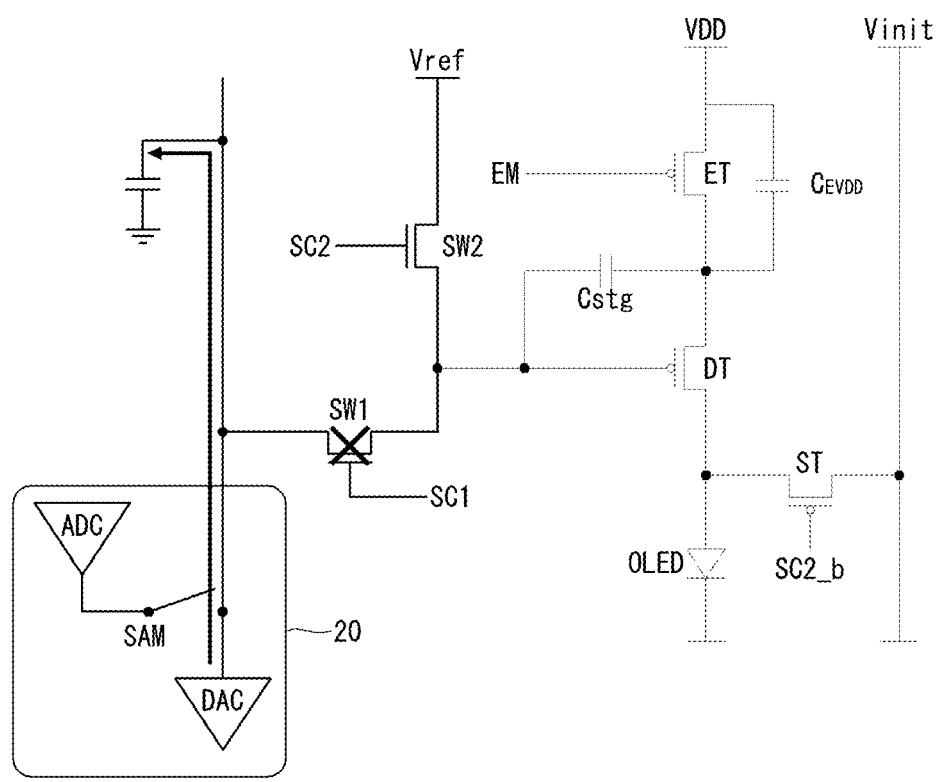
FIGS. 11 to 13 are equivalent circuit diagrams illustrating an operation state of a pixel according to driving signals of FIG. 10.
Figure 12:
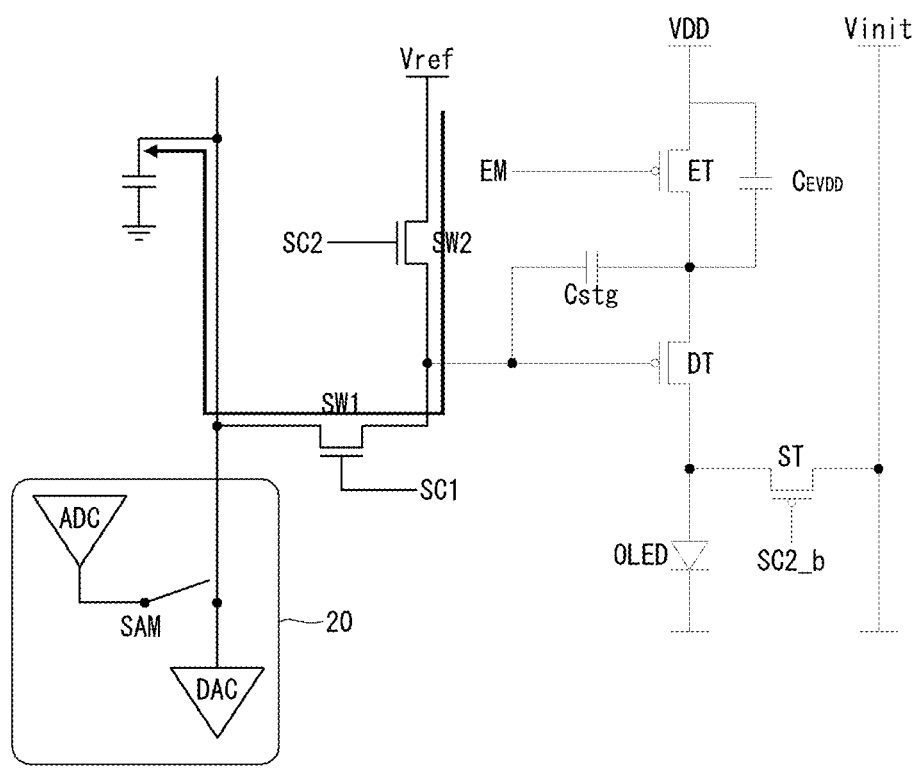
Figure 13:
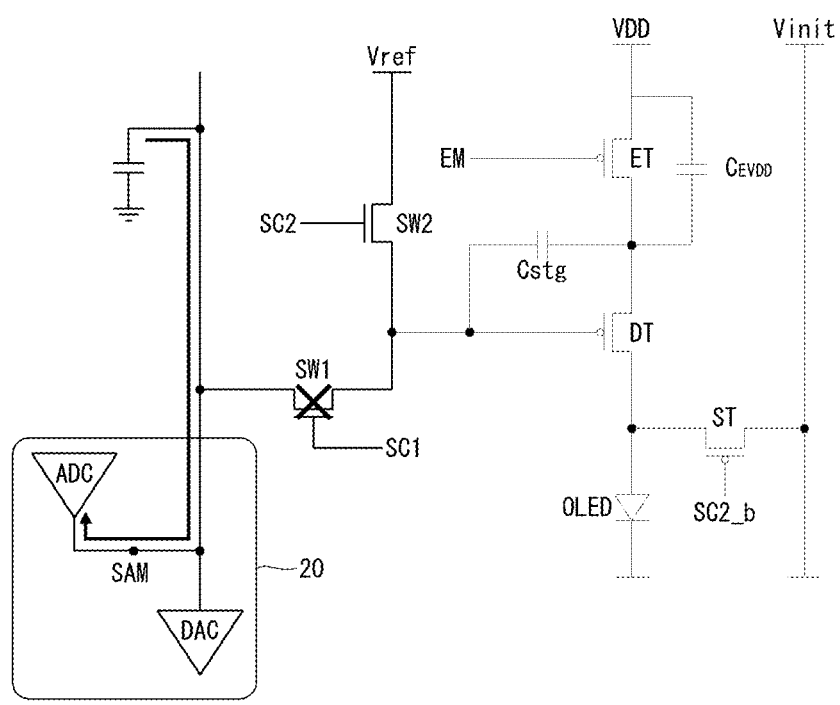

FIGS. 11 to 13 are equivalent circuit diagrams illustrating an operation state of a pixel PXL during an initialization period Ti, a sensing period Tsen, and a sampling period Tsmp in FIG. 10, respectively.

Referring to FIG. 11, in the initialization period Ti, since the first scan signal SC1 is input to at a low level L, the first switching TFT SW1 is turned off. Since the second scan signal SC2 is input at a high level H, the second switching TFT SW2 is turned on. Here, the second scan signal SC2 is input at a high level H of a voltage sufficiently higher than the Vref, and the second switching TFT SW2 is turned on. The IC unit 20 initializes Vdata and Vdata Line load to 0V, that is, a state that no sensed value is, using the DAC voltage. The sampling switch SAM in the IC unit 20 is kept in the OFF state. The sensed voltage is kept at 0V, that is, a state that no sensed value is. And, Vdata and Vdata line load are initialized and the source node of the first switching TFT SW1 is initialized.

Referring to FIG. 12, in the sensing period Tsen, since the first scan signal SC1 is input at a high level H, the first switching TFT SW1 is turned on. Here, the first scan signal SC1 is a signal having a voltage lower than the Vref and is input at a high level H signal in a range capable of adjusting a current flowing in the first switching TFT SW1.

Since the second scan signal SC2 is input at a high level H, the second switching TFT SW2 is turned on. Here, since the second scan signal SC2 is input at a high level H of a voltage sufficiently higher than the Vref, the second switching TFT SW2 is kept turn on.

And, the Vref current is transmitted through the second switching TFT SW 2 and the first switching TFT SW1, so that the Vdata line load is maintained at a high level H, that is, a state that data is input. The sampling switch SAM in the IC unit 20 is kept in the OFF state. The sensed voltage is sensed according to the threshold voltage of the first switching TFT SW1. And, the Vref current adjusted according to the threshold voltage of the first switching TFT SW1 is transmitted to the Vdata and the Vdata line load.

Referring to FIG. 13, during the sampling period Tsmp, since the first scan signal SC1 is input at a low level L, the first switching TFT SW1 is turned off. Thus, the Vref is no longer input to the Vdata line. The second scan signal SC2 is input at a high level H. The second scan signal SC2 is input at a high level H which is sufficiently higher than the Vref so that the second switching TFT SW2 is kept turn on. Therefore, although the Vref is transmitted as it is through the second switching TFT SW2, since the first switching TFT SW1 is turned off, only the current charged in the sensing period Tsen remains in Vdata and Vdata line load. The Vdata signal is maintained at a high level H, that is, a state that data is input. The sampling switch SAM in the IC unit 20 is turned on to sample the voltage of the current sensed by the Vdata line load. As a result, the threshold voltage of the first switching TFT SW1 can be sensed.

Figure 14:
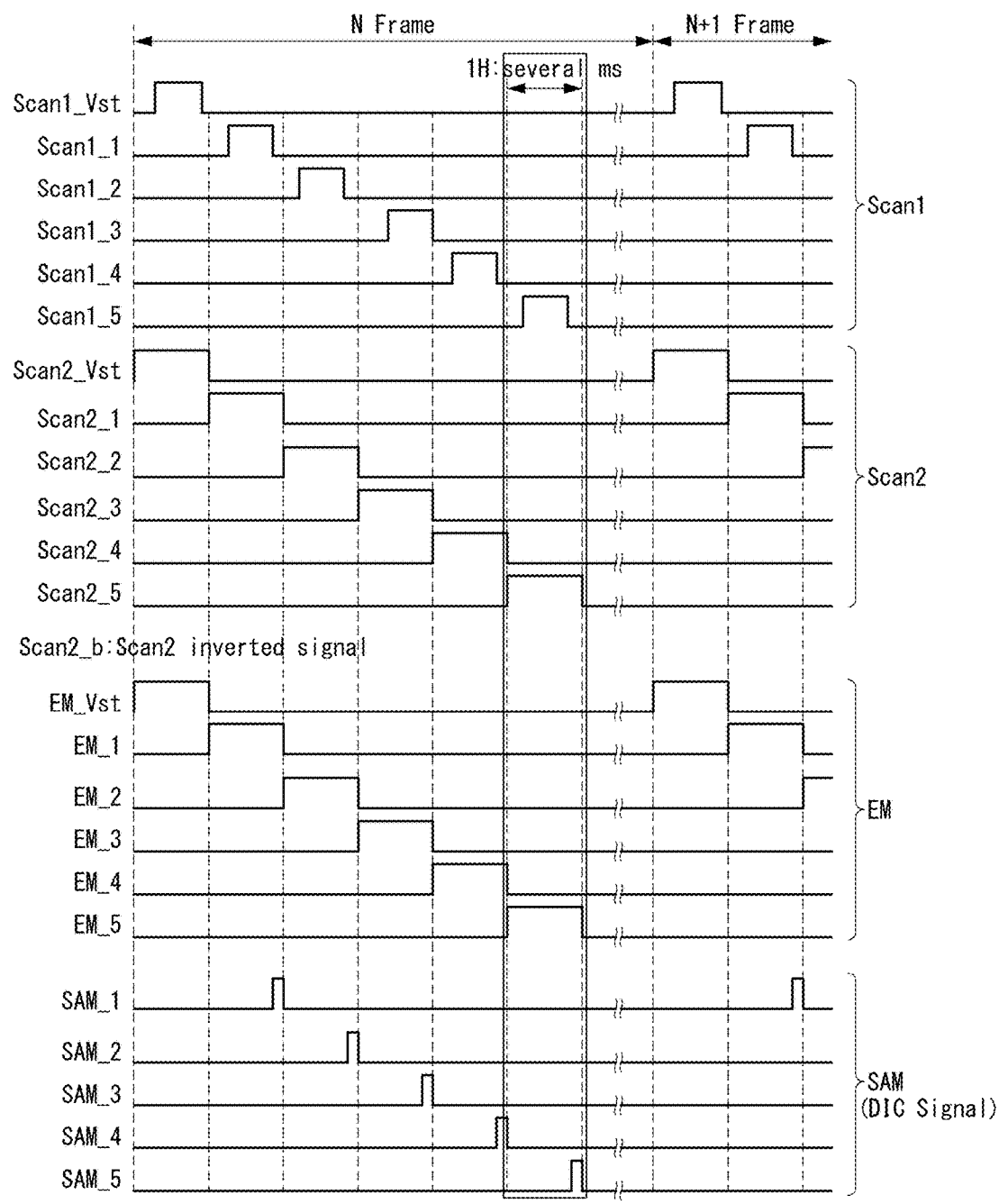
FIG. 14 is a diagram illustrating driving signals input to sense characteristics of a switching TFT of a display device according to an aspect of the present disclosure.

FIG. 14 is a diagram illustrating driving signals input to sense characteristics of a switching TFT of a display device according to an aspect of the present disclosure.

In the display panel 10, a plurality of pixels PXL are arranged in a matrix form and connected to one scan line 15 in common. As shown in FIG. 13, the first scan signal SC1, the second scan signal SC2 and the emission control signal EM are shifted to the plurality of pixels PXL connected in common to one scan line 15, and can be sequentially supplied to the scan lines. The third scan signal can be referred to the emission control signal.

The first scan signal SC1, the second scan signal SC2, the emission control signal EM and the sampling switch signal SAM may be output from the scan driver 13 under the control of the IC unit 20.

The first scan signal SC1, the second scan signal SC2, the emission control signal EM and the sampling switch signal SAM may be input in units of one frame (N Frame, N+1 Frame, N+2 Frame . . . ), and an 1H time at which a high level H signal is output may be set to several milliseconds (ms).

The sampling switch signal SAM is turned on during a period in which the first scan signal SC1 and the second scan signal SC2 are input at a high level H and then falling so that the voltage of the Vdata line load is sampled as a digital signal.

As a result of the above driving, the threshold voltage characteristic of the first switching TFT SW1 of the plurality of pixels PXL commonly connected to one scan line 15 in units of one frame can be sensed and confirmed as a digital signal.

Figure 15:
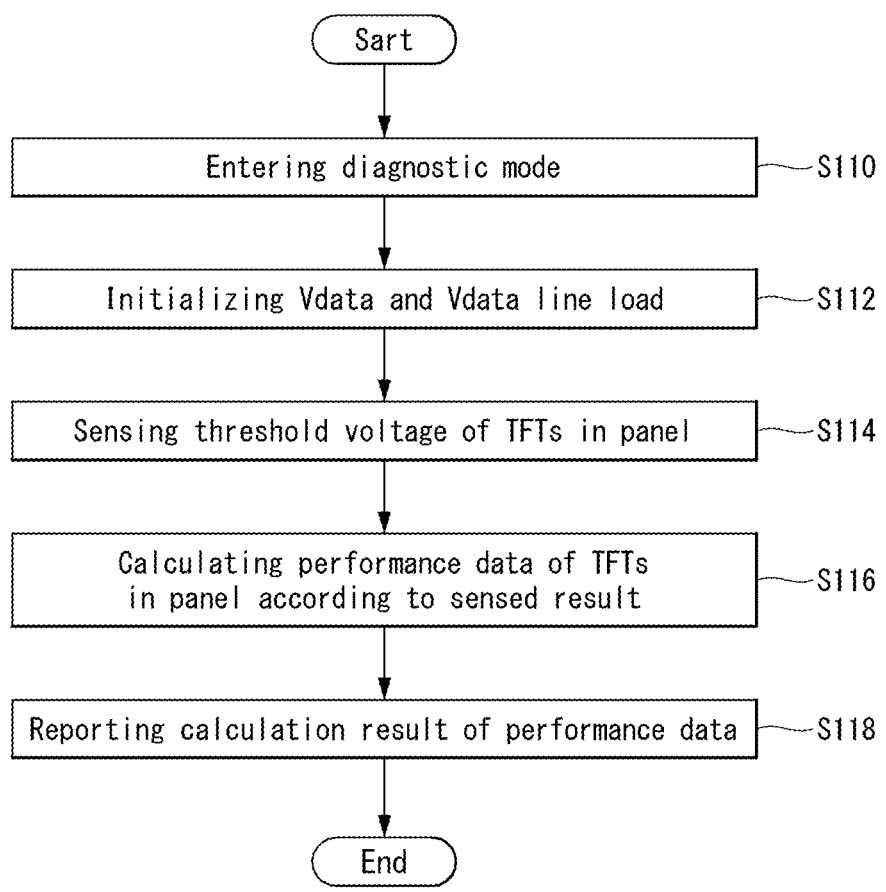
FIG. 15 is a flowchart illustrating a process of sensing characteristics of a switching TFT of a display device according to an aspect of the present disclosure.

FIG. 15 is a flowchart illustrating a process of sensing characteristics of a switching TFT of a display device according to an aspect of the present disclosure.

In an electroluminescent display in which a pixel PXL circuit including an oxide TFT is implemented, the present disclosure discloses a technique capable of sensing and reporting characteristics of a switching TFT, for example, a threshold voltage of an oxide TFT that performs a switching function. A series of processes of sensing and reporting the threshold voltage of the oxide TFT can be performed under the control of the IC unit 20 provided in the display device. The functions performed by the IC unit 20 are performed by any one of the ICs that perform the functions of the timing controller 11, the source driver 12, and the scan driver 13. One or more of these may be integrated and performed in a driving IC implemented as one driving circuit.

The IC unit 20 of the display device performing a diagnostic function can enter a diagnostic mode if a predetermined condition is satisfied S110. When a user performs a quality test at the time of production of the display device or when the user selects the diagnostic function of the display device or the display device enters the diagnostic mode according to a predetermined period, the threshold voltage of the switching TFT included in the pixel PXL can be detected.

When the diagnostic mode is entered, the IC unit 20 initializes the Vdata line load by using the DAC voltage S112. Thus, the source node of the oxide switch TFT to sense the threshold voltage is initialized.

When the initialization is completed, the IC unit 20 applies a predetermined voltage to the gate of the oxide switching TFT of which the threshold voltage is to be sensed, controls the voltage Vref to be applied to the drain of the oxide switching TFT, and then can sense the threshold voltage of the oxide switching TFT by measuring the load of the source node of the oxide switching TFT, that is, the Vdata line load S114.

The IC unit 20 can calculate performance data of TFTs in the panel according to the sensed result of the threshold voltage of the oxide switching TFT included in each pixel PXL S116. The IC unit 20 can calculate the performance data by various methods such as numerically calculating a ratio of defective TFTs to the total number of the oxide switching TFTs or a defective ratio with respect to the screen area according to the sensed result of the threshold voltage.

The IC unit 20 can report the calculation result of the performance data S118. The IC unit 20 can display the calculation result of the performance data to the user or transmit it via a network.

Figure 16:
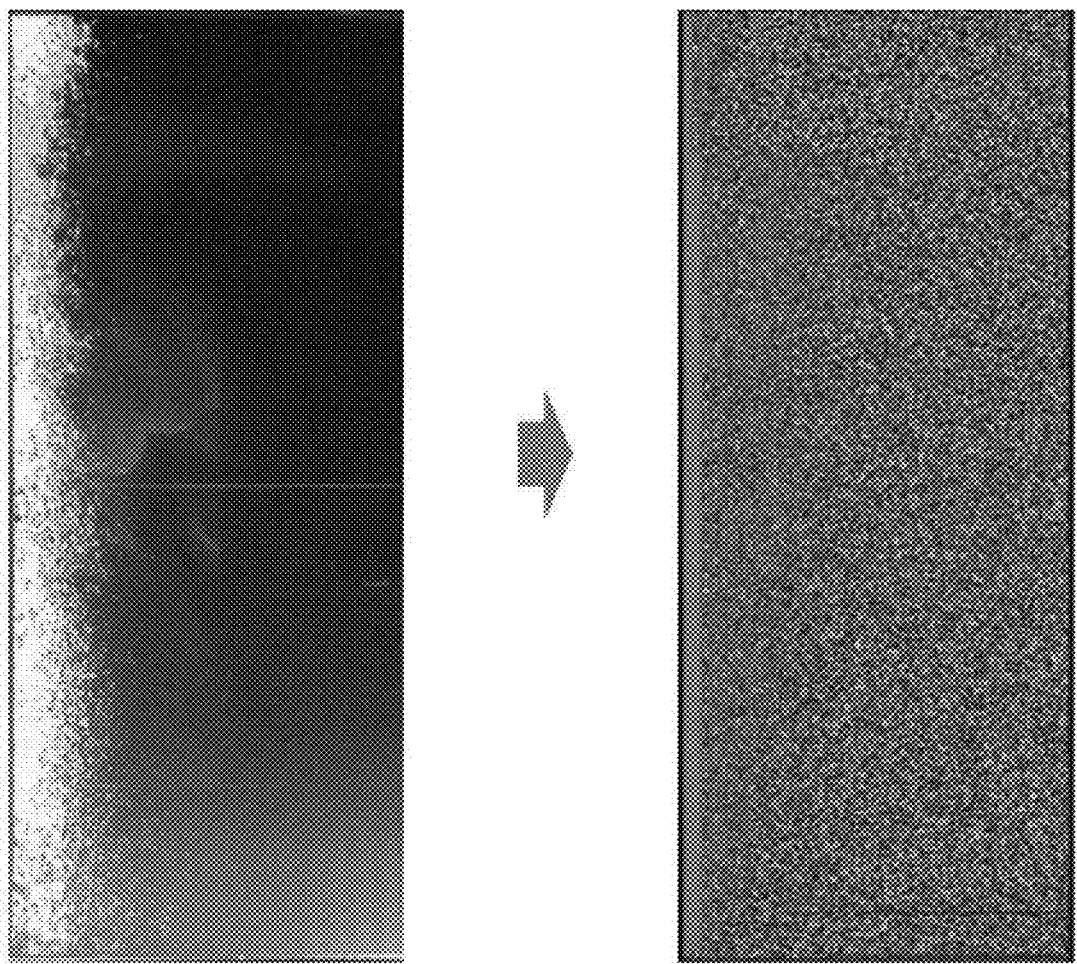
FIG. 16 is an aspect of displaying sensed characteristics of a switching TFT as graphic data on a display device according to an aspect of the present disclosure.

FIG. 16 is an aspect of displaying sensed characteristics of a switching TFT as graphic data on a display device according to an aspect of the present disclosure.

The IC unit 20 can display the pixel PXL determined to contain the defective TFT to be visually distinguished from the other pixels PXL according to the sensed result of the threshold voltage. Therefore, the performance data of the TFTs in the panel can be displayed to the user in a form of graphic data.

As shown in FIG. 16, according to the sensed result of the performance data of the TFT in the panel in an image of the panel which is originally black, the defective pixel can be visualized as black dot and displayed. Such a visualization method can be changed in various ways such as changing a color of the defective pixel according to a user setting or displaying it as numerical data instead of the color.

Figure 17:
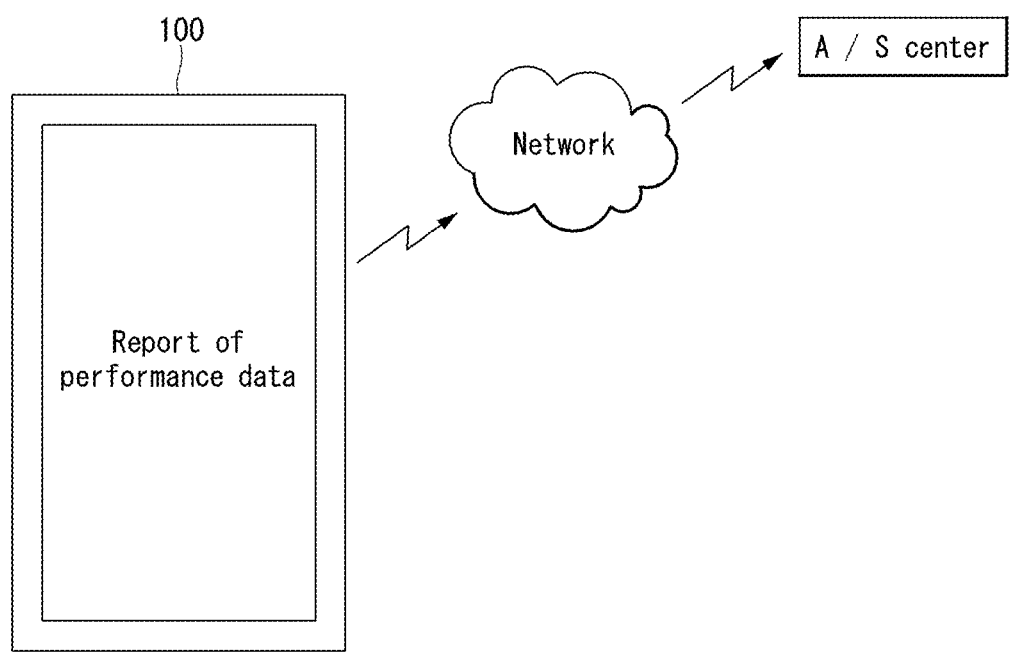
FIG. 17 is a diagram illustrating an aspect of collecting and managing sensed characteristics of a switching TFT through a network according to an aspect of the present disclosure.

FIG. 17 is a diagram illustrating an aspect of collecting and managing sensed characteristics of a switching TFT through a network according to an aspect of the present disclosure.

An electronic device 100 to which the IC unit 20 of the present disclosure is applied can transmit the sensed result of the threshold voltage through the network and transmit it to a server on the network, for example, an after-sales service A/S center server 110 of a manufacturer.

Upon receiving the sensed result, the after-sales service A/S center server 110 can determine a degree of failure of the sensed switching TFT and provide services such as guiding an after-sales service A/S application to the user when repair is required. In addition, the after-sales service A/S center server 110 can collect and manage information related to the switching TFT characteristics of each display device. Therefore, the after-sales service A/S center server 110 can be effectively applied to quality control and performance improvement of the display device.

Although aspects have been described with reference to a number of illustrative aspects thereof, it should be understood that numerous other modifications and aspects can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising subpixels including a data line, a scan line, and a plurality of thin film transistors (TFTs), comprising:
   a second switching TFT having gate, source and drain nodes and outputting a reference signal input through the drain node to the source node according to a second scan signal input through the gate node;
   a first switching TFT having gate, source and drain nodes, the drain node of the first switching TFT directly connected to the source node of the second switching TFT, and the first switching TFT forming a current path such that the reference signal input through the drain node is transmitted to the data line connected to the source node of the first switching TFT according to a first scan signal input through the gate node; and
   an integrated circuit (IC) unit sensing a voltage of a current transmitted to the data line through the first switching TFT and sensing a threshold voltage of the first switching TFT based on the sensed voltage,
   wherein the reference signal, the first scan signal and the second scan signal are generated from the IC unit.

2. The display device of claim 1, wherein the IC unit includes a digital to analog converter (DAC) outputting a predetermined analog signal such that a load of the data line connected to the source of the first switching TFT is initialized when the first switching TFT is in an off state.

3. The display device of claim 1, wherein the IC unit includes an analog to digital converter (ADC) sensing a voltage of a current transmitted to the data line through the first switching TFT and outputting the sensed voltage as a digital signal.

4. The display device of claim 3, wherein the IC unit includes a sampling switch adjusting a timing of the outputting the digital signal.

5. The display device of claim 1, wherein the first switching TFT and the second switching TFT are formed of an N-type oxide TFT; and
wherein at least one switching TFT for driving the subpixel is implemented as an N-type low temperature polysilicon (LTPS) TFT or a combination of an N-type LTPS TFT and a P-type LTPS TFT.

6. A method of sensing element characteristics of a display device comprising subpixels including a data line, a scan line, a second switching TFT having gate, drain and source nodes, inputting a reference signal through the drain node and outputting the reference signal to the source node, and a first switching TFT having gate, drain and source nodes, the drain node connected to the source node of the second switching TFT, and the source node connected to the data line, the method comprising:
applying a second scan signal to the second switching TFT to output the reference signal input through the drain node to the source node;
applying a first scan signal to the first switching TFT to output the reference signal input through the drain node to the source node; and
sensing a voltage of a current transmitted to the data line through the first switching TFT and sensing a threshold voltage of the first switching TFT based on the sensed voltage.

7. The method of claim 6, further comprising:
applying the first scan signal to turn off the first switching TFT; and
outputting a predetermined analog signal to the data line so that a load of the data line to which the first switching TFT is connected is initialized.

8. The method of claim 6, wherein the sensing a threshold voltage of the first switching TFT comprises:
sensing a voltage of a current transmitted to the data line according to a predetermined period; and
outputting the sensed voltage as a digital signal.

9. The method of claim 6, wherein the first switching TFT and the second switching TFT are formed of an N-type oxide TFT; and
wherein at least one switching TFT for driving the subpixel is implemented as an N-type LTPS TFT or a combination of an N-type LTPS TFT and a P-type LTPS TFT.

10. A display device comprising subpixels including a data line, a scan line, and a plurality of thin film transistors (TFTs), comprising:
a second switching TFT having gate, drain and source nodes, outputting a reference signal input through the drain node to the source node according to a second scan signal input through the gate node;
a first switching TFT having gate, drain and source nodes, the drain node of the first switching TFT directly connected to the source node of the second switching TFT, and forming a current path such that the reference signal input through the drain node is transmitted to the data line connected to the source node of the first switching TFT according to a first scan signal input through the gate node; and
an IC unit, when a predetermined condition is satisfied, being switched to a diagnostic mode, sensing a voltage of a current transmitted to the data line through the first switching TFT, sensing a threshold voltage of the first switching TFT based on the sensed voltage, and reporting the sensed threshold voltage of the first switching TFT to a server of a customer service center,
wherein the reference signal, the first scan signal and the second scan signal are generated from the IC unit.

11. The display device of claim 10, wherein the IC unit is configured to display a pixel determined to contain a defective TFT to be visually distinguished from other pixels as a graphical screen according to the sensed result of the threshold voltage of the first switching TFT and report the sensed threshold voltage of the first switching TFT.

12. The display device of claim 10, wherein the IC unit is configured to transmit the sensed result of the threshold voltage of the first switching TFT to a predetermined server through a network and report the sensed threshold voltage of the first switching TFT.

13. The display device of claim 10, wherein the first switching TFT and the second switching TFT are formed of an N-type oxide TFT; and
wherein at least one switching TFT for driving the subpixel is implemented as an N-type LTPS TFT or a combination of an N-type LTPS TFT and a P-type LTPS TFT.

14. The display device of claim 10, wherein the predetermined condition is satisfied when a quality test is performed on the display device at a production site, a diagnostic function of the display device is selected, or the display device is entered a predetermined diagnostic mode.

15. A display device comprising subpixels including a data line, a scan line, and a plurality of thin film transistors (TFTs), comprising:
a second switching TFT having gate, drain and source nodes, outputting a reference signal input through the drain node to the source node according to a second scan signal input through the gate node;
a first switching TFT having gate, drain and source nodes, the drain node of the first switching TFT directly connected to the source node of the second switching TFT, and forming a current path such that the reference signal input through the drain node is transmitted to the data line connected to the source node of the first switching TFT according to a first scan signal input through the gate node; and
an IC unit sensing a voltage of a current transmitted to the data line through the first switching TFT, sensing a threshold voltage of the first switching TFT based on the sensed voltage, and reporting the sensed threshold voltage of the first switching TFT to a server of a customer service center when a quality test is performed on the display device at a production site, a diagnostic function of the display device is selected, or the display device is entered a predetermined diagnostic mode,
wherein the reference signal, the first scan signal and the second scan signal are generated from the IC unit.

16. The display device of claim 15, wherein the IC unit displays a pixel determined to contain a defective TFT to be visually distinguished from other pixels as a graphical screen according to the sensed result of the threshold voltage of the first switching TFT and report the sensed threshold voltage of the first switching TFT.

17. The display device of claim 15, wherein the IC unit transmits the sensed result of the threshold voltage of the first switching TFT to a predetermined server through a network and report the sensed threshold voltage of the first switching TFT.

18. The display device of claim 15, wherein the first switching TFT and the second switching TFT are formed of an N-type oxide TFT, wherein at least one switching TFT for driving the subpixel is implemented as an N-type LTPS TFT or a combination of an N-type LTPS TFT and a P-type LTPS TFT.

19. The display device of claim 15, wherein the IC unit includes a digital to analog converter (DAC) outputting a predetermined analog signal such that a load of the data line connected to the source of the first switching TFT is initialized when the first switching TFT is in an off state.

20. The display device of claim 15, wherein the IC unit includes an analog to digital converter (ADC) sensing a voltage of a current transmitted to the data line through the first switching TFT and outputting the sensed voltage as a digital signal.

21. The display device of claim 20, wherein the IC unit includes a sampling switch adjusting a timing of the outputting the digital signal.

* * * * *